United States Patent
Ye et al.

(10) Patent No.: US 9,627,367 B2
(45) Date of Patent: Apr. 18, 2017

(54) MEMORY DEVICES WITH CONTROLLERS UNDER MEMORY PACKAGES AND ASSOCIATED SYSTEMS AND METHODS

(71) Applicant: Micron Technology, Inc., Boise, ID (US)

(72) Inventors: Seng Kim Ye, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 14/550,243

(22) Filed: Nov. 21, 2014

(65) Prior Publication Data

US 2016/0148918 A1    May 26, 2016

(51) Int. Cl.
*H01L 25/18*  (2006.01)
*H01L 25/065* (2006.01)
(Continued)

(52) U.S. Cl.
CPC .......... *H01L 25/18* (2013.01); *G06F 13/1694* (2013.01); *H01L 24/16* (2013.01); *H01L 24/32* (2013.01); *H01L 25/0657* (2013.01); *H01L 25/50* (2013.01); *H01L 22/14* (2013.01); *H01L 23/3128* (2013.01); *H01L 24/13* (2013.01); *H01L 24/29* (2013.01); *H01L 24/33* (2013.01); *H01L 24/48* (2013.01); *H01L 24/49* (2013.01); *H01L 24/73* (2013.01); *H01L 24/81* (2013.01); *H01L 24/83* (2013.01); *H01L 24/92* (2013.01); *H01L 2224/04042* (2013.01); *H01L 2224/1319* (2013.01); *H01L 2224/13083* (2013.01);
(Continued)

(58) Field of Classification Search
CPC ..... H01L 25/18; H01L 25/50; H01L 25/0657; H01L 21/56; H01L 23/3107; H01L 24/85; H01L 24/49; H01L 22/14; H01L 23/49838; H01L 24/32; H01L 24/73; G06F 13/16
USPC ............... 257/686, 685, 723, 724, 778, 777; 711/154; 438/107, 17
See application file for complete search history.

(56) References Cited

U.S. PATENT DOCUMENTS 8,116,100 B2 * 2/2012 Saen ..................... H01L 23/481
                                                    257/685
8,890,294 B2 * 11/2014 Cho ...................... H01L 21/565
                                                    257/659
(Continued)

FOREIGN PATENT DOCUMENTS

TW        200828561 A    7/2008
TW        201436118 A    9/2014

OTHER PUBLICATIONS

International Search Report and Written Opinion mailed Feb. 25, 2016 in International Application No. PCT/US2015/061592, 14 pages.
(Continued)

Primary Examiner — Alexander Oscar Williams
(74) Attorney, Agent, or Firm — Perkins Coie LLP (57) ABSTRACT

Memory devices with controllers under stacks of memory packages and associated systems and methods are disclosed herein. In one embodiment, a memory device is configured to couple to a host and can include a substrate, a stack of memory packages, and a controller positioned between the stack and the substrate. The controller can manage data stored by the memory packages based on commands from the host.

29 Claims, 6 Drawing Sheets

(51) Int. Cl.
*H01L 21/56* (2006.01)
*G06F 13/16* (2006.01)
*H01L 23/498* (2006.01)
*H01L 23/31* (2006.01)
*H01L 25/00* (2006.01)
*H01L 23/00* (2006.01)
*H01L 21/66* (2006.01)

(52) U.S. Cl.
CPC ............... *H01L 2224/16225* (2013.01); *H01L 2224/291* (2013.01); *H01L 2224/2919* (2013.01); *H01L 2224/2939* (2013.01); *H01L 2224/29294* (2013.01); *H01L 2224/32014* (2013.01); *H01L 2224/32145* (2013.01); *H01L 2224/32225* (2013.01); *H01L 2224/33181* (2013.01); *H01L 2224/48091* (2013.01); *H01L 2224/48145* (2013.01); *H01L 2224/48227* (2013.01); *H01L 2224/49113* (2013.01); *H01L 2224/73253* (2013.01); *H01L 2224/73257* (2013.01); *H01L 2224/73265* (2013.01); *H01L 2224/81855* (2013.01); *H01L 2224/81856* (2013.01); *H01L 2224/83191* (2013.01); *H01L 2224/83855* (2013.01); *H01L 2224/83874* (2013.01); *H01L 2224/92227* (2013.01); *H01L 2224/92247* (2013.01); *H01L 2225/0651* (2013.01); *H01L 2225/06506* (2013.01); *H01L 2225/06562* (2013.01); *H01L 2225/06565* (2013.01); *H01L 2924/00014* (2013.01); *H01L 2924/1033* (2013.01); *H01L 2924/10253* (2013.01); *H01L 2924/14* (2013.01); *H01L 2924/143* (2013.01); *H01L 2924/1431* (2013.01); *H01L 2924/1434* (2013.01); *H01L 2924/1436* (2013.01); *H01L 2924/1437* (2013.01); *H01L 2924/1438* (2013.01); *H01L 2924/1443* (2013.01); *H01L 2924/15184* (2013.01); *H01L 2924/15192* (2013.01); *H01L 2924/15311* (2013.01); *H01L 2924/181* (2013.01); *H01L 2924/3025* (2013.01)

(56) References Cited

U.S. PATENT DOCUMENTS

2003/0127719 A1    7/2003    Chang
2007/0090517 A1    4/2007    Moon et al.
2008/0237310 A1    10/2008   Periaman et al.
2009/0020885 A1*   1/2009    Onodera ................. H01L 23/13
                                                          257/777
2009/0161402 A1*   6/2009    Oh ........................... G11C 5/02
                                                          365/51
2009/0166887 A1*   7/2009    Upadhyayula ......... H01L 21/561
                                                          257/777
2009/0218670 A1*   9/2009    Yamamoto ........ H01L 23/49838
                                                          257/686
2009/0321960 A1*   12/2009   Okumura .......... H01L 23/49838
                                                          257/777
2011/0029153 A1    2/2011    Shah et al.
2011/0062563 A1*   3/2011    Yang ................... G11C 16/0483
                                                          257/666
2013/0119542 A1*   5/2013    Oh ....................... H01L 25/0657
                                                          257/738
2013/0161788 A1*   6/2013    Chun ...................... H01L 24/05
                                                          257/532
2013/0214396 A1    8/2013    Kim et al.
2013/0234342 A1*   9/2013    Shibata ................... G11O 5/063
                                                          257/774
2014/0097513 A1*   4/2014    Lee ................... H01L 23/49816
                                                          257/528
2015/0115464 A1*   4/2015    Yu ......................... H01L 21/486
                                                          257/774
2015/0131397 A1*   5/2015    Takeyama ............. G11C 16/20
                                                          365/230.03
2015/0187745 A1*   7/2015    Chiu ....................... H01L 25/18
                                                          257/738
2015/0221624 A1*   8/2015    Ye .......................... H01L 25/00
                                                          257/777
2015/0301933 A1*   10/2015   Tuers ................... G06F 12/0246
                                                          714/773
2015/0311185 A1*   10/2015   Ng .......................... H01L 25/18
                                                          257/784
2015/0311186 A1*   10/2015   Ye .......................... H01L 25/18
                                                          257/777
2016/0293560 A1*   10/2016   Liao ........................ H01L 24/14

OTHER PUBLICATIONS

Office Action mailed Aug. 22, 2016 in Taiwan Application No. 104138661, 12 pages.

* cited by examiner

MEMORY DEVICES WITH CONTROLLERS UNDER MEMORY PACKAGES AND ASSOCIATED SYSTEMS AND METHODS

The disclosed embodiments relate to memory devices with memory packages and controllers. In several embodiments, the present technology relates to memory devices that include embedded controllers located under a stack of memory packages.

BACKGROUND

Flash memory is commonly used to store data for smart phones, navigation systems (e.g., automobile navigation systems), digital cameras, MP3 players, computers, and many other consumer electronic devices. Uniform Serial Bus (USB) devices, memory cards, embedded drives, and other data storage devices often include flash memory due to its small form factor. Dedicated memory controllers in electronic devices can manage data stored on flash memory. Unfortunately, these dedicated memory controllers can decrease the available space in the electronic devices for other components. To reduce the size of electronic devices, memory controllers can be integrated into host processors to, for example, increase the available space for other electronic components. For example, host processors may have integrated memory controllers (IMC) that manage data stored by flash memory, but these IMCs are compatible with specific types of memory and often cannot support new types of memory, such as new NAND memory designed for future standards (e.g., future versions of the embedded MultiMediaCard (eMMC) standard specification). Because IMCs limit electronic devices to particular types of flash memory, those electronic devices may be unable to use new memory with higher storage density, improved performance, or enhanced functionality.

Memory controllers can also be embedded within multi-die memory packages. For example, conventional eMMC memory can be a single high-capacity NAND package (e.g., a NAND package with stacked dies) with an embedded MultiMediaCard (MMC) controller. The embedded MMC controller can free a host processor from performing NAND memory management (e.g., write, read, erase, error management, etc.) that may require significant computing resources. Because NAND dies have small features that make testing difficult, the individual NAND dies are not tested before packaging. Multi-die NAND packages can be tested to identify bad packages (e.g., packages with bad NAND dies) to be discarded. Unfortunately, embedded MMC controllers in bad NAND packages are also discarded, resulting in increased manufacturing costs.

DETAILED DESCRIPTION

Specific details of several embodiments of memory devices and associated systems and methods are described below. The term "memory device" generally refers to a package having a package substrate, one or more multi-die memory packages, and a controller. The controller can be positioned under the memory packages and can provide memory management for each memory package. In some embodiments, memory devices can be flash memory (e.g., eMMC memory, Universal Flash Storage, etc.) with multi-die memory packages suitable for mobile devices (e.g., smart phones, tablets, MP3 players, etc.), digital cameras, routers, gaming systems, navigation systems, computers, and other consumer electronic devices. For example, the multi-die memory packages can be, for example, flash memory packages, such as NAND packages, NOR packages, etc. A person skilled in the relevant art will also understand that the technology may have additional embodiments, and that the technology may be practiced without several of the details of the embodiments described below with reference to FIGS. 1-6.

Figure 1:
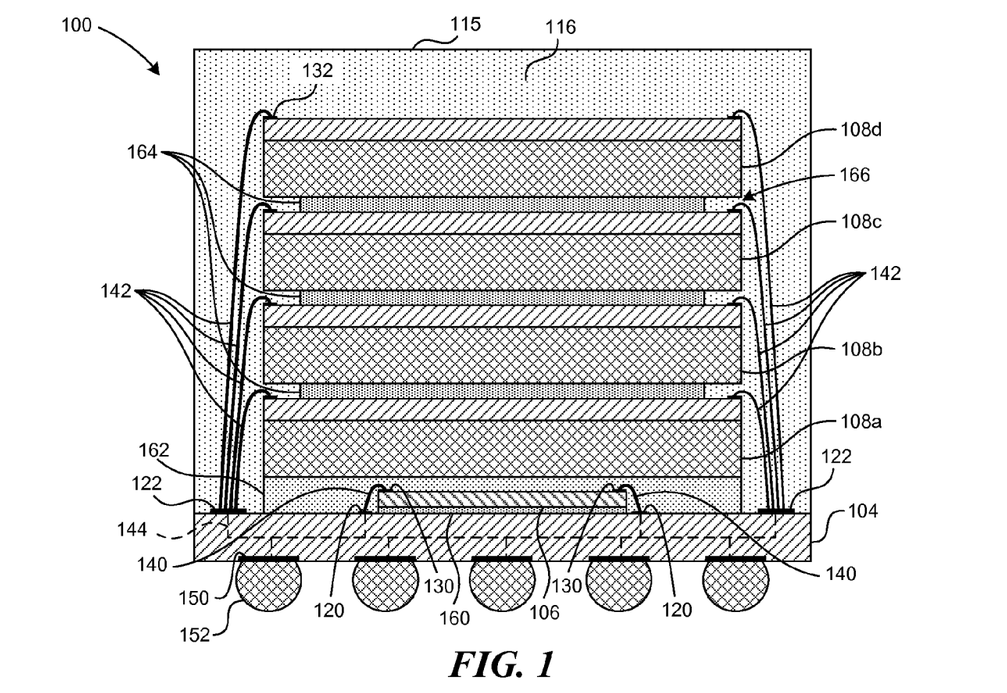
FIG. 1 is a cross-sectional view of a memory device configured in accordance with an embodiment of the present technology.

FIG. 1 is a cross-sectional view of a memory device 100 configured in accordance with an embodiment of the present technology. The memory device 100 can include a package substrate 104 ("substrate 104"), a controller 106, and first, second, third and fourth multi-die memory packages 108a, 108b, 108c, 108d (collectively "memory packages 108") arranged in a stack. The substrate 104 can be electrically coupled to the controller 106 and the memory packages 108 such that the controller 106 interfaces between the memory packages 108 and a host (e.g., a host processor of an electronic device) in communication with the memory device 100. The controller 106 can be attached to the substrate 104. In some embodiments, the controller 106 can be positioned under the stack of memory packages 108 such that the memory device 100 has a relatively small footprint.

The controller 106 can handle memory management so that a host processor is free to perform other tasks. In various embodiments, the controller 106 can include circuitry, software, firmware, memory, or combinations thereof and can be configured to manage flash memory (e.g., NAND memory, NOR memory, etc.). In some embodiments, the controller 106 can be a controller die that includes a semiconductor substrate, such as silicon, silicon-on-insulator, compound semiconductor (e.g., Gallium Nitride), or other suitable substrates and can have any of variety of integrated circuit components or functional features, such as dynamic random-access memory (DRAM), static random-access memory (SRAM), other forms of integrated circuit devices, including processing circuits, imaging components, and/or other semiconductor devices for managing memory or other components. For example, the controller 106 can be a multi-media controller die (e.g., a MMC controller die) configured for use with NAND memory and can include circuitry, registers, interface modules (e.g., modules for interfacing with hosts, modules for interfacing with memory packages, etc.), and/or other modules for providing desired functionality.

The substrate 104 can include first bond pads 120 and second bond pads 122. The first bond pads 120 can be coupled to corresponding bond pads 130 of the controller 106 by first wire bonds 140, and the second bond pads 122 can be coupled to corresponding package contacts 132 (one identified) of each of the memory packages 108 by second wire bonds 142. In one embodiment, the substrate 104 is a single interposer that electrically couples the controller 106 to each memory package 108. The substrate 104 can include, for example, a printed circuit board, a multimedia card substrate, or other suitable interposer having electrical connectors 144 (shown schematically in dashed line), such as metal traces, vias, or other suitable connectors. The electrical connectors 144 can couple the controller 106, the first bond pads 120, and/or the second bond pads 122 to one another and/or to external circuitry (not shown) via package contacts 150 (one identified) and interconnects 152 (one identified) at the lower side of the substrate 104. The interconnects 152 can be bump bonds or other suitable connection features.

The controller 106 can be attached to the package substrate 104 by an adhesive 160. The adhesive 160 be an adhesive material (e.g., epoxy resin, adhesive paste, etc.), an adhesive laminate (e.g., adhesive tape, die-attach or dicing-die-attach film, etc.), or other suitable material. The first memory package 108a can be attached to the substrate 104 by an adhesive 162 that covers the controller 106 and the wire bonds 140. The additional memory packages 108b-d, in turn, are attached to one another by adhesive 164. In several embodiments, the adhesives 160, 162, 164 can comprise the same or similar materials. The adhesive 162 can have a greater thickness than the adhesive 164 to accommodate the portions of the wire bonds 140 between the controller 106 and the memory package 108a. The thickness of the adhesive 164 can be sufficiently large to ensure that the wire bonds 142 pass through gaps 166 (one identified) between adjacent memory packages 108. The memory device 100 can further include a package casing 115 comprising an encapsulant 116 that at least partially encapsulates the memory packages 108 and the wire bonds 142.

Figure 2:
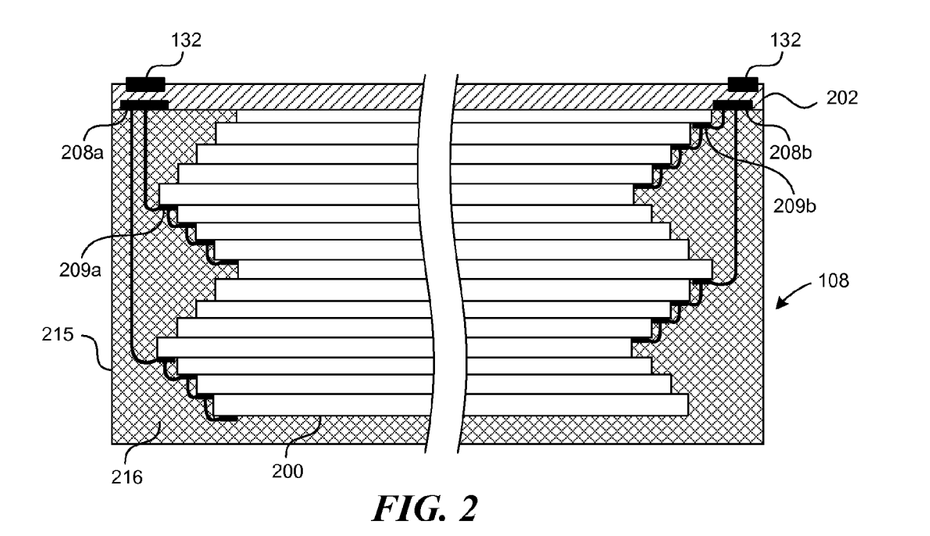
FIG. 2 is a cross-sectional view of a multi-die memory package configured in accordance with an embodiment of the present technology.

FIG. 2 is a cross-sectional view of a memory package 108 configured in accordance with an embodiment of the present technology. The memory package 108 can include a plurality of memory semiconductor dies 200 (one identified) and a memory package substrate 202 ("package substrate 202"). The package substrate 202 can include a plurality of first bond pads 208a and a plurality of second bond pads 208b. The first bond pads 208a can be coupled (e.g., wire bonded) to corresponding bond pads 209a (one identified) of a first group of the semiconductor dies 200 (e.g., two sets of four dies), and the second bond pads 208b can be coupled (e.g., wire bonded) to corresponding bond pads 209b (one identified) of a second group of the semiconductor dies 200 (e.g., two sets of four dies). In some embodiments, an array of the bond pads 208a is electrically coupled to an array of bond pads 209a of each semiconductor die 200. The configuration, number, and sizes of the bond pads 208a, 208b can be selected based on the configuration, number, and sizes of the respective bond pads 209a, 209b. In some embodiments, a row of bond pads 208b is electrically coupled to a row of bond pads 209b of each semiconductor die 200. The package substrate 202 can include, for example, an interposer, a printed circuit board, or other suitable substrate having electrical connectors, such as metal traces, vias, or other suitable connectors, including package contacts 132 (e.g., bond pads), interconnects (e.g., bump bonds) and/or other features for electrically coupling the memory package 108 to the substrate 104 (FIG. 1).

FIG. 2 shows the semiconductor dies 200 in a vertically stacked arrangement with adjacent semiconductor dies 200 laterally offset from one another. In other embodiments, the semiconductor dies 200 can be vertically stacked directly above one another (i.e., without any lateral offset), or in any other suitable stacked arrangement, and can be formed from semiconductor substrates, such as silicon substrates, silicon-on-insulator substrates, compound semiconductor (e.g., Gallium Nitride) substrates, or other suitable substrates. The semiconductor dies 200 can be cut or singulated dies and can have any of variety of integrated circuit components or functional features, such as non-volatile memory, flash memory (e.g., NAND flash memory, NOR flash memory, etc.), DRAM, SRAM, other forms of integrated circuit devices (e.g., processing circuits, imaging components and/or other semiconductor devices). Although the illustrated memory package 108 includes 16 memory dies 200, the memory package 108 can also be a multichip package with more or less than 16 memory dies (e.g., one die, two dies, four dies, eight dies, ten dies, twenty dies, etc.). The number of dies can be selected based on the desired storage capacity of the memory package 108. Because the embedded controller 106 can manage multiple memory packages, one or more of the memory packages (e.g., all the memory packages 108) may not have any embedded controller dies for memory management.

The memory package 108 can further include a package casing 215 composed of an encapsulant 116 (e.g., a thermoset material, an epoxy resin, or other suitable material) that at least partially encapsulates the stack of semiconductor dies 200 and the wire bonds. The package casing 215 can provide shielding from the ambient (e.g., from humidity), electrical isolation (e.g., between wire bonds), and/or protection of internal components during handling.

FIGS. 3A-3E are cross-sectional views illustrating a method for assembling the memory device 100 at various stages of manufacture in accordance with an embodiment of the present technology. Generally, the controller 106 can be coupled to the substrate 104 and then first memory package 108a can be coupled to the substrate 104 such that the controller 106 is positioned between the first memory package 108a and the package substrate 104. Additional memory packages can be stacked on the memory package 108a. After the memory packages 108 are electrically coupled to the substrate 104, the memory packages 108 can be encapsulated by the encapsulant 116. Details of the stages of manufacture are discussed in detail below.

Figure 3A:
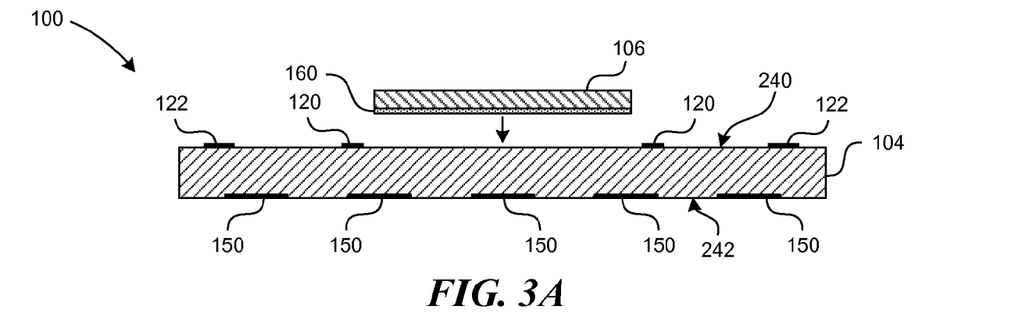
FIGS. 3A-3E are cross-sectional views illustrating a memory device at various stages of manufacture in accordance with an embodiment of the present technology.

Referring to FIG. 3A, the first and second bond pads 120, 122 can be located along an upper surface 240 of the substrate 104 (e.g., a silicon wafer with circuitry), and the package contacts 150 can be located along a lower surface 242 of the substrate 104. The controller 106 typically has a smaller footprint than the packages 108, so the controller 106 can be attached and electrically coupled to the substrate 104 before stacking the package assemblies 108. Advantageously, the controller 106 and its electrical connections (e.g., wire bonds 140) do not interfere with stacking and attaching of the memory packages 108. As shown in FIG. 3A, the controller 106 carrying the adhesive 160 can be placed on the upper surface 240 of the substrate 104 such that the controller 106 is spaced apart from the bond pads 120, 122 to provide sufficient clearance for wire bonding. The adhesive 160 can be die-attach adhesive paste or an adhesive element, for example, a die-attach film or a dicingdie-attach film (known to those skilled in the art as "DAF" or "DDF," respectively). In one embodiment, the adhesive 160 can include a pressure-set adhesive element (e.g., tape or film) that adheres the controller 106 to the substrate 104 when it is compressed beyond a threshold level of pressure. In another embodiment, the adhesive 160 can be a UV-set tape or film that is set by exposure to UV radiation.

Figure 3B:
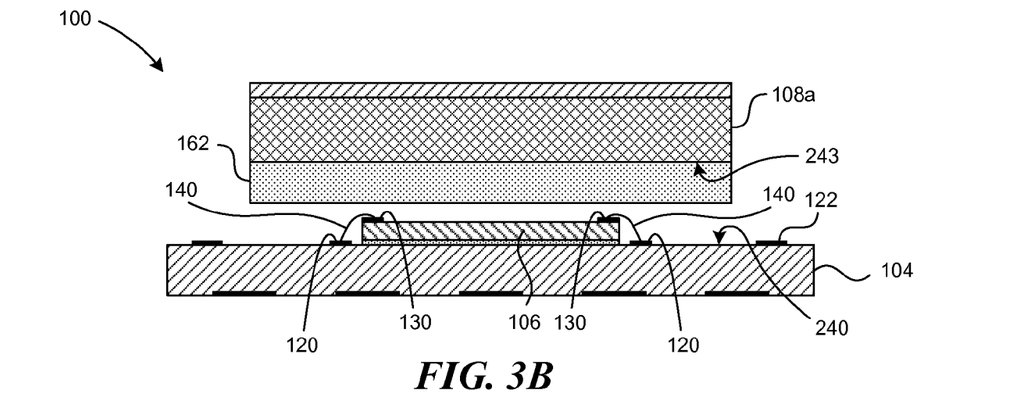

FIG. 3B shows the memory device 100 after attaching the controller 106 to the substrate 104 and forming the first wire bonds 140. Opposing lateral sides of the controller 106 can have an array of bond pads 130 (e.g., a row of bond pads 130) coupled to corresponding bond pads 120 (e.g., a row of bond pads 120) by the wire bonds 140. The package 108*a* can carry the adhesive 162 in the form of a "film-over-wire" material suitable for use with wire bonds. In other embodiments, the controller 106 can be directly coupled to the substrate 104 using solder or other suitable direct die attachment techniques. In such embodiments, the adhesive 162 can be DAF or DDF. The memory package 108*a* with the adhesive 162 can be placed on the upper surface 240 of the substrate 140 such that the memory package 108*a* extends laterally outward beyond the periphery of the controller 106. As such, the entire controller 106 can be located directly between the memory package 108*a* and the substrate 104 during assembly. The thickness of the adhesive 162 can be sufficiently large to prevent contact between a lower surface 243 of the memory package 108*a* and the wire bonds 140 to avoid damaging the wire bonds 140. Additionally, the bond pads 120 can be positioned directly underneath the memory package 108*a* to ensure that the electrical connections for the controller 106 do not interfere with subsequent wire bonding processes.

Figure 3C:
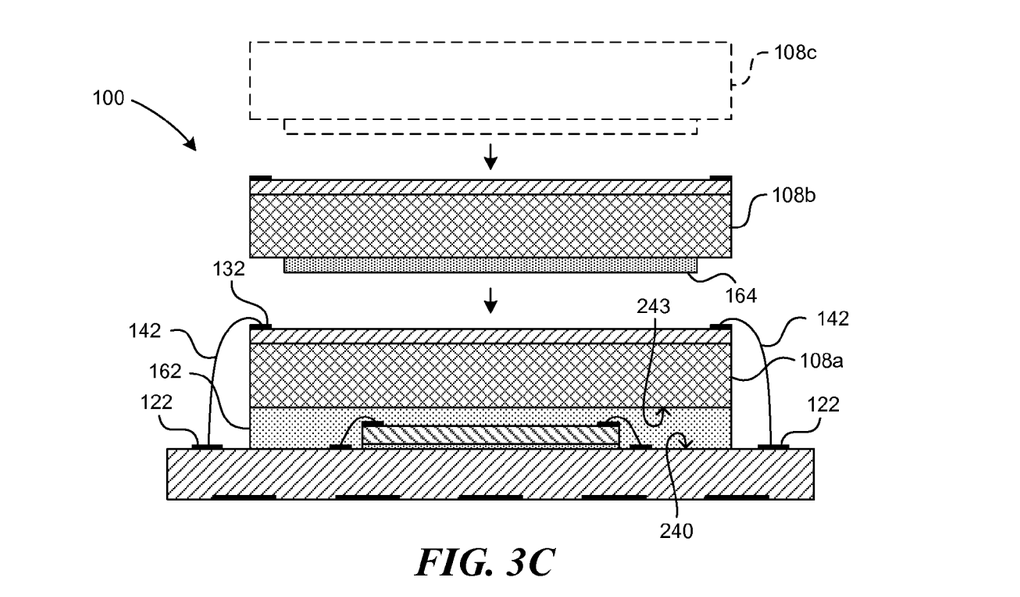

FIG. 3C shows the memory device 100 after attaching the memory package 108*a* to the substrate 104 and forming the second wire bonds 142. The second memory package 108*b* can be attached to the first memory package 108*a* using the adhesive 164. Additional memory packages (memory package 108*c* is shown in hidden line) can be stacked on the memory packages 108 and electrically coupled to the substrate 104. The thickness of the adhesive 164 can be selected to maintain a desired distance between adjacent memory packages 108 to avoid damaging the wire bonds 142. For example, the adhesive 164 can be sufficiently thick to prevent contact between the wire bonds 142 and the adjacent memory package 108 immediately above such wire bonds 142.

Figure 3D:
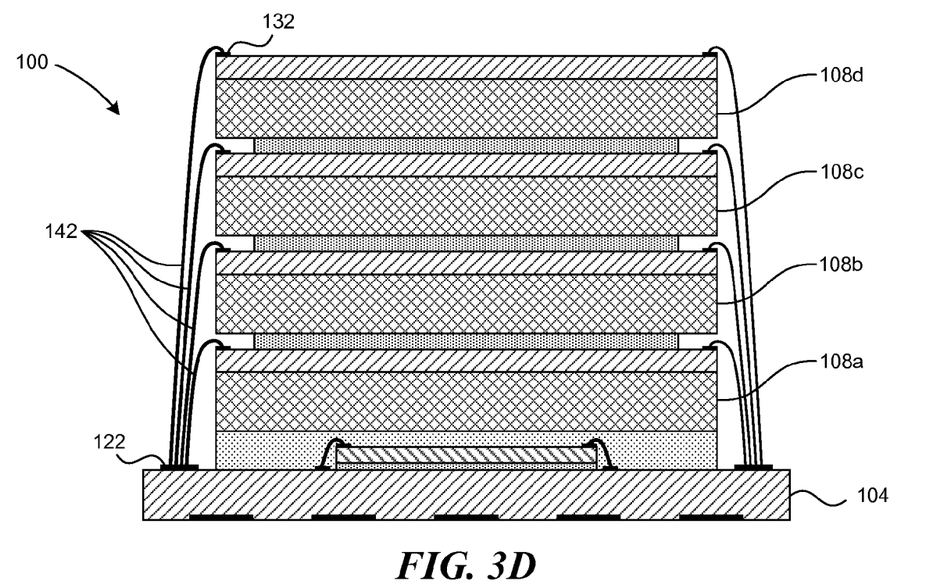

FIG. 3D shows the memory device 100 after each memory package 108 has been electrically coupled to the substrate 104 by the wire bonds 142. Opposing lateral sides of each memory package 108 can have an array of bond pads 132 (e.g., a row of bond pads 132) that are coupled to corresponding bond pads 122 (e.g., a row of bond pads 122) by the wire bonds 142. The illustrated memory device 100 has four memory packages 108. In other embodiments, the memory device 100 can carry more or fewer memory packages 108, for example, a single memory package 108, two memory packages 108, five memory packages 108, eight memory packages 108, ten memory packages 108, 15 memory packages 108, etc. The memory device 100 can include other packages or dies in addition to and/or in lieu of one or more of the memory packages 108. The number, configuration, and arrangement of memory packages and/or dies can be selected based on the desired functionality and dimensions of the memory device 100.

The memory packages 108 can be arranged in a vertical stack such that the memory packages 108 are centered relative to each other when viewed from above. Such an aligned arrangement can provide memory device 100 with a relative small footprint. In other embodiments, the vertically stacked memory packages 180 can be laterally offset from one another to provide increased clearance for accessing the bond pads 132. The direction and distance of lateral offset can be selected based on, for example, the wire bonding process or other subsequent processes. The memory packages 108 can be stacked in other arrangements and configurations to provide packages with desired overall sizes.

Figure 3E:
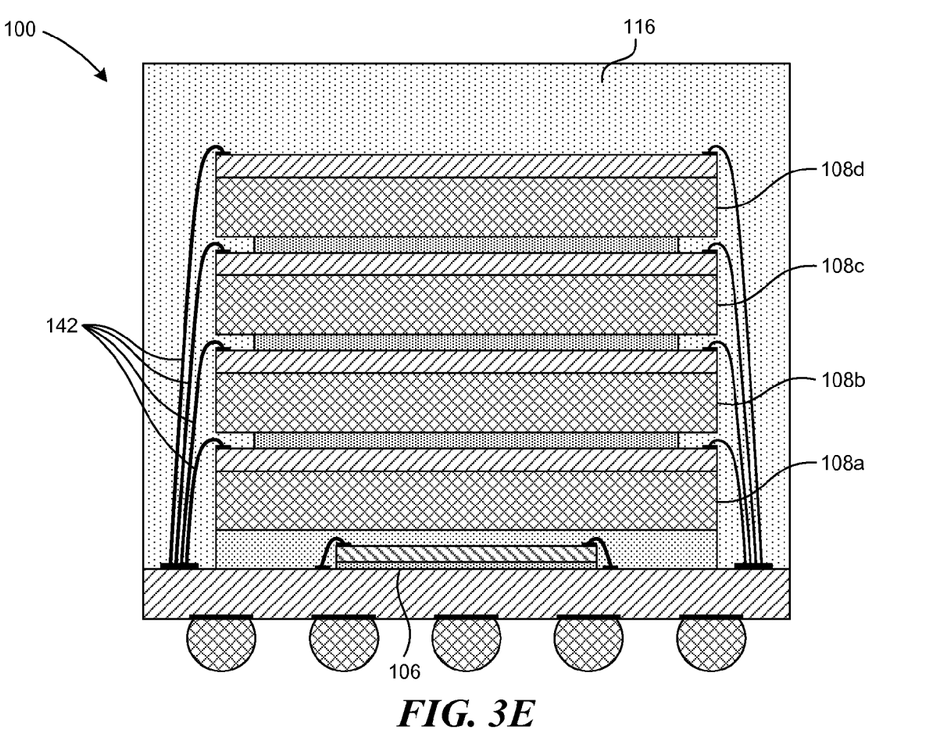

FIG. 3E shows the memory device 100 after the encapsulant 116 at least partially encapsulates the stack of memory packages 108 and the wire bonds 142 (one group of wire bonds is identified). The encapsulant 116 can include, for example, a thermoset material, a resin (e.g., epoxy resin), or other suitable material that provides, for example, mechanical support, shielding from the ambient (e.g., from humidity), and/or electrical isolation (e.g., between wire bonds). In some embodiments, the memory packages 108 and wire bonds 146 can be completely encapsulated by the encapsulant 116. After encapsulating the memory packages 108, processing can continue with subsequent manufacturing stages, such forming ball bonds, singulating, dicing, or other desired processes.

The manufacturing process of FIGS. 3A-3E can increase product yields because individual components can be tested before assembly. The memory packages 108 can be individually tested to ensure that each memory package 108 has known good dies (KGDs). For example, each memory package 108 can be tested to test each of the semiconductor dies 108 (FIG. 2). Advantageously, the substrate 202 (FIG. 2) of the memory package 108 can have relative large connections suitable for testing with standard testing equipment. The memory packages 108 with KGDs can be selected for assembly into packages while memory packages 108 with known bad dies can be discarded. Accordingly, the substrates 104 and controllers 106 are assembled only with good memory packages 108 to provide high production yields. Additionally, the substrate 104 can have a standard ball grid array or other suitable features (e.g., test pads) for testing the substrate 104, controller 106, memory packages 108, and/or other internal components after assembly. Defective memory devices 100 can be identified and discarded.

Figure 4:
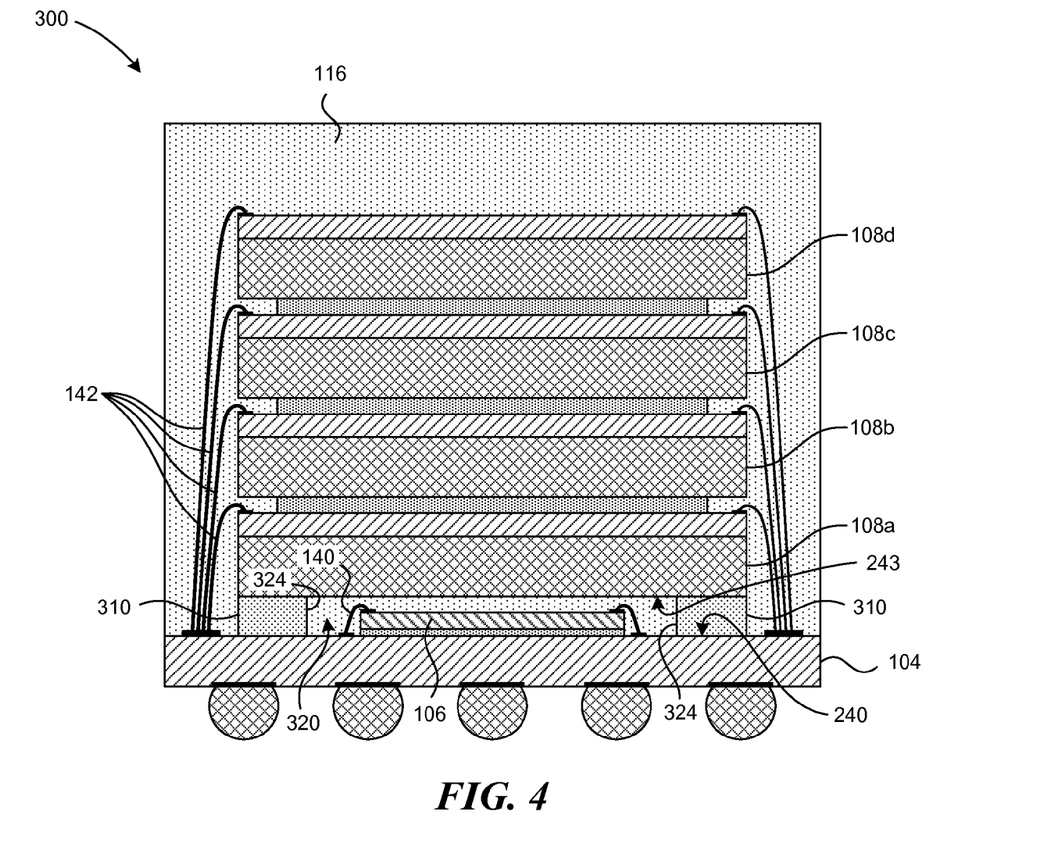
FIG. 4 is a cross-sectional view of a memory device configured in accordance with another embodiment of the present technology.

FIG. 4 is a cross-sectional view of a memory device 300 configured in accordance with another embodiment of the present technology. The memory device 300 can include features generally similar to those of memory device 100 described in connection with FIGS. 1-3E. The memory device 300 can include the memory packages 108 electrically coupled to the package substrate 104 by wire bonds 142 (one set identified), and the controller 106 can be electrically coupled to the package substrate 104 by the wire bonds 140 (one identified). The memory device 300 can also include one or more spacers 310 between the memory package 108*a* and the substrate 104. The spacers 310 can be cut or singulated pieces of silicon, or other suitable material, dimensioned to position the first memory package 108*a* slightly above the controller 106 and the wire bonds 140. An adhesive (e.g., adhesive paste, DAFs, adhesive tape, etc.) can be used to secure the spacers 310 to the substrate 104 and/or memory package 108*a*. Other types of spacers 310, such as a b-stage resin, can be used to space the memory package 108*a* apart from the substrate 104 by a desired distance and to secure the memory package 108*a*. The b-stage resin can be cured to fully adhere the memory package 108*a* to the substrate 104.

The encapsulant 116 can partially or completely encapsulate the stacked memory packages 108 and wire bonds 142, and the encapsulant 116 can also extend into a cavity 320 between the first memory package 108a and the substrate 104. The cavity 320 can be defined by sidewalls 324 of the spacers 310, the lower surface 243 of the memory package 108a, and the upper surface 240 of the substrate 104. During manufacturing, the encapsulant 116 can flow into the cavity 320 to at least partially encapsulate the controller 106 and the wire bonds 140 so that the encapsulant 116 electrically isolates the electrical connections coupling the controller 106 to the substrate 104.

Figure 5:
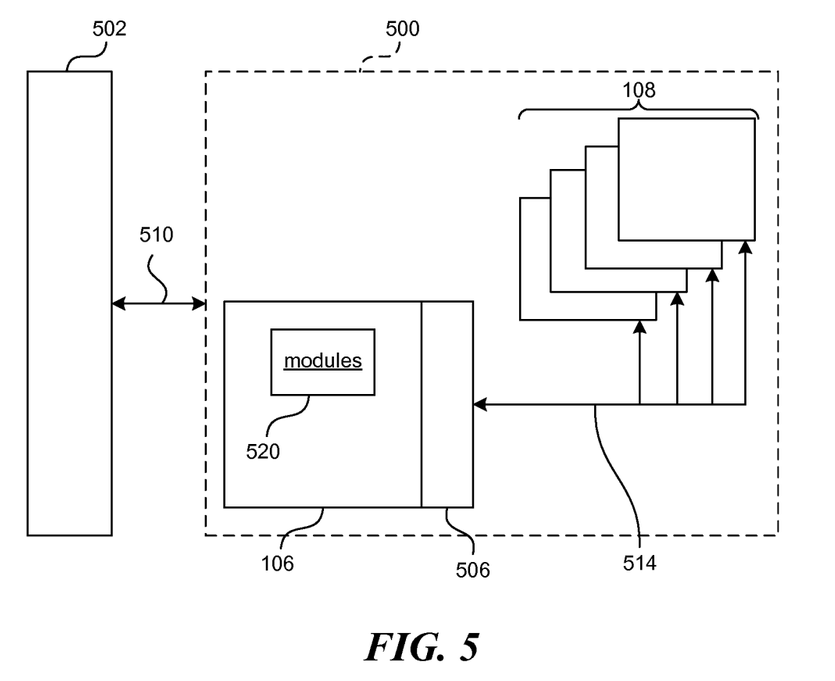
FIG. 5 is a block circuit diagram illustrating an implementation suitable for memory devices in accordance with an embodiment of the present technology.

FIG. 5 is a block circuit diagram illustrating an implementation of memory devices in accordance with an embodiment of the present technology. A memory device 500 can be one of the memory devices 100, 300 or can include features generally similar to those of memory devices 100, 300. The memory device 500 can be a package that manages data transfer between a host 502 and each of the memory packages 108. The controller 106 can be configured to provide memory control and can include one or more modules 520 for providing functionality. The modules 520 can include, without limitation, error correction code (ECC) modules for error corrections, error detection code (EDC) modules for error detection, wear levelling modules, address mapping modules for mapping of logical to physical blocks, modules for block management (e.g., bad block management, spare block management, etc.), error recovery modules, modules for partition protection, modules for booting from the controller 106, or other desired modules. The controller 106 can interface with the host 502 via a bus 510 and can include an interface 506 operatively coupled to the memory packages 108 via a memory bus 514. The controller 106 can be a MMC controller designed according to the MultiMediaCard specification (e.g., specification, versions 4.4, 4.41, etc.). In some embedded multimedia card (eMMC) embodiments, the controller 106 can have a bus 510 that provides bidirectional data signals (e.g., data signals for single bit data transfers, 4-bit data transfers, 8-bit data transfers, etc.), receives command signals from the host 502, responds to the host 502, and/or clocks signals for synchronizing bus transfers.

The host 502 can include a device with processing power and can be capable of interfacing with the memory device 500. The host 502 may be a component (e.g., host controller, hardware, processor, driver, etc.) of a mobile device, a personal computer, a game console, or other electronic device capable of providing command input to the memory device 500. The controller 106 can manage data (e.g., write, read, erase data) based on the command input from the host 502.

Figure 6:
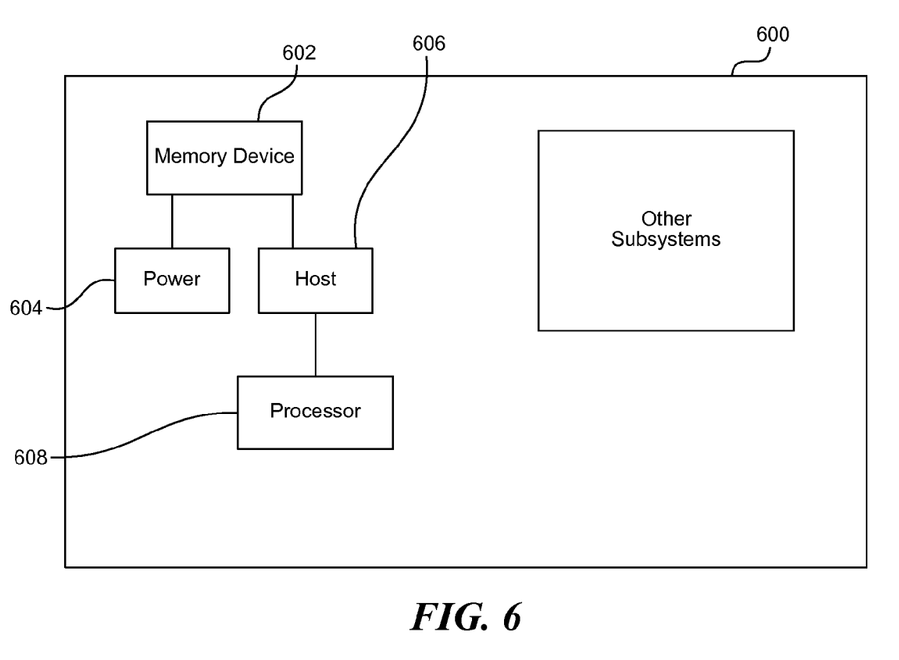
FIG. 6 is a schematic view of a system that includes a memory device configured in accordance with embodiments of the present technology.

Any one of the memory devices described herein can be incorporated into any of a myriad of larger and/or more complex systems, such as system 600 shown schematically in FIG. 6. The system 600 can include a memory device 602, a power source 604, a host 606 (e.g., I/O driver), a processor 608, and/or other subsystems or components 610. The memory device 602 can be one of the memory devices 100, 300, 500 or include features generally similar to those of the memory devices described above. The host 606 can include features generally similar to the host 502 of FIG. 5. The resulting system 600 can perform any of a wide variety of functions, such as memory storage, data processing, and/or other suitable functions. Accordingly, representative systems 600 can be, without limitation, hand-held devices (e.g., mobile phones, tablets, digital readers, and digital audio players), computers, digital cameras, appliances, and vehicles (e.g., cars, boats, planes). Components of the system 600 may be housed in a single unit or distributed over multiple, interconnected units (e.g., through a communications network). If the memory device 602 is removable, it can be replaced with another memory device (e.g., a new memory device with more advanced functionality). Each of the memory devices can be have an embedded controller configured to manage memory to avoid incompatibility between the host 606 and the onboard memory.

The size of the memory devices disclosed herein can be selected based on the size of the electronic device. By way of example, the memory device 100 of FIG. 1 or the memory device 300 of FIG. 4 can have a height in a range of about 4 mm to 7 mm, a width in a range of about 13 mm to 17 mm, and a length in a range of about 17 mm to 25 mm. Memory packages 108 (see FIGS. 1 and 2) can have heights in a range of about 0.75 mm to 1.5 mm (e.g., 1.2 mm), widths in a range of about 12 mm to 16 mm, and lengths in a range of about 16 mm to 20 mm.

The memory devices described herein can be incorporated into various types of storage devices. The memory devices (e.g., memory devices 100 or 300 in FIG. 1 or 4) with NAND packages can be incorporated into USB drives, memory cards, solid state drives, or other high density memory storage devices. Memory devices (e.g., memory devices 100 or 300 in FIG. 1 or 4) with NOR packages can be part of embedded devices. The memory devices disclosed herein can use different types of package-in-package (PIP) technologies, system-in-package (SIP) technologies, or other desired packaging technologies and can have, for example, ball grid arrays. For example, the memory devices 100 or 300 in FIG. 1 or 4 can be packages with a standard ball grid array.

From the foregoing, it will be appreciated that specific embodiments of the technology have been described herein for purposes of illustration, but that various modifications may be made without deviating from the disclosure. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list. Additionally, the terms "vertical," "lateral," "upper" and "lower" can refer to relative directions or positions of features in the memory devices in view of the orientation shown in the Figures. These terms, however, should be construed broadly to include memory devices and its components having other orientations, such as being flipped on their side or inverted.

Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed is:

1. A memory device, comprising:
   a package substrate;
   a stack structure including
      a stacked plurality of memory packages with semiconductor dies, wherein the stacked plurality of memory packages is attached to the package substrate, and
      a controller attached to the package substrate and positioned between the stacked plurality of memory packages and the package substrate, wherein the controller is configured to manage each of the memory packages; and
   an encapsulant attached to a periphery of the package substrate surrounding the stack structure, and the encapsulant encapsulating the stack of memory packages.

2. The memory device of claim 1 wherein the controller is configured to manage data transfer to and from each of the memory packages.

3. The memory device of claim 1 wherein the package substrate includes a plurality of first bond pads and a plurality of second bond pads, and wherein the memory device further includes
   a plurality of first wire bonds that couple the plurality of first bond pads to the memory packages; and
   a plurality of second wire bonds that couple the plurality of second bond pads to the controller.

4. The memory device of claim 1 wherein each of the memory packages includes a substrate, a plurality of memory semiconductor dies, and a package casing at least partially encapsulating the memory semiconductor dies.

5. The memory device of claim 1 wherein each of the memory packages is a multichip package electrically connected to the package substrate.

6. The memory device of claim 1 wherein each of the memory packages is attached to an adjacent one of the memory packages by a die-attach adhesive.

7. The memory device of claim 1 wherein the stacked plurality of memory packages includes a first memory package and a second memory package, wherein the first memory package is attached to the package substrate, and the second memory package is attached to the first memory package by a die-attach adhesive.

8. The memory device of claim 1 wherein the memory packages comprises flash memory and includes NAND memory and/or NOR memory.

9. The memory device of claim 1 wherein each of the memory packages is a NAND package without an embedded controller.

10. The memory device of claim 1 wherein the controller is positioned between a bottom one of the memory packages in the stack and the package substrate.

11. The memory device of claim 1, further comprising a spacer between the stack of memory packages and the package substrate, and wherein the spacer is spaced laterally apart from the controller.

12. The memory device of claim 1 wherein the controller is configured to command the memory packages to read data, erase data, and/or write data.

13. The memory device of claim 1 wherein the controller is positioned outside each of the memory packages.

14. A multimedia device configured to couple to a host, comprising:
   an interposer;
   a stack of multichip memory packages electrically coupled to the interposer, wherein the stack of multichip memory packages is mounted on the interposer;
   a multimedia controller die attached to the interposer and positioned between the stack of multichip memory packages and the interposer, wherein the multimedia controller die is configured to manage data transfer between the host and each of the multichip memory packages; and
   an encapsulant encapsulating the stack of multichip memory packages and attached to the interposer.

15. The multimedia device of claim 14 wherein the multimedia controller die is coupled to each of the memory packages.

16. The multimedia device of claim 14 wherein the multimedia controller die is configured to provide error correction, block management, wear levelling, and/or physical to logical mapping.

17. The multimedia device of claim 14 wherein the multimedia controller die includes a memory interface coupled to each of the multichip memory packages.

18. The multimedia device of claim 14 wherein each multichip memory package is a NAND package.

19. A method of manufacturing a memory package, the method comprising:
   attaching a controller to a package substrate;
   attaching a first memory package to the package substrate such that the controller is positioned between the first memory package and the package substrate;
   attaching a second memory package to the first memory package; and
   encapsulating the first and second memory packages such that an encapsulant is attached to the package substrate and surrounds the controller and the first and second memory packages.

20. The method of claim 19, further comprising
   wirebonding the controller to the package substrate; and
   wirebonding the first and second memory packages to the package substrate.

21. The method of claim 19, further comprising flowing encapsulant into a cavity between the package substrate and the first memory package such that the encapsulant at least partially encapsulates the controller.

22. The method of claim 19 wherein attaching the first memory package to the package substrate includes attaching the first memory package to the package substrate such that most of the controller is positioned directly between the first memory package and the package substrate.

23. The method of claim 19 wherein attaching the first memory package to the package substrate includes mounting the first memory package to the package substrate such that wire bonds coupling the controller to the package substrate are directly between the first memory package and the package substrate.

24. The method of claim 19 wherein the controller is a multimedia controller and the first and second memory packages are NAND packages and/or NOR packages.

25. The method of claim 19, further comprising testing the first and second packages to identify know good packages prior to attaching the first and second memory packages to the package substrate.

26. The method of claim 19, further comprising stacking additional memory packages on the second memory package before encapsulating the first and second memory packages and the additional packages.

27. The memory device of claim 1 wherein the stacked plurality of memory packages, the controller, and the encapsulant are mounted on the package substrate.

28. The memory device of claim 1 wherein the controller is positioned directly between portions of the encapsulant.

29. The multimedia device of claim 14 wherein the multimedia controller die is positioned directly between portions of the encapsulant.

\* \* \* \* \*